United States Patent
Li et al.

(10) Patent No.: US 12,300,510 B2
(45) Date of Patent: May 13, 2025

(54) METHOD FOR MANUFACTURING SEMICONDUCTOR DEVICE

(71) Applicant: Tokyo Electron Limited, Tokyo (JP)

(72) Inventors: Chun-Huai Li, Hsinchu (TW); Chi-Wen Chen, Hsinchu (TW)

(73) Assignee: Tokyo Electron Limited, Tokyo (JP)

( * ) Notice: Subject to any disclaimer, the term of this patent is extended or adjusted under 35 U.S.C. 154(b) by 522 days.

(21) Appl. No.: 17/806,730

(22) Filed: Jun. 13, 2022

(65) Prior Publication Data

US 2023/0064487 A1  Mar. 2, 2023

(30) Foreign Application Priority Data

Sep. 1, 2021  (TW) .................................. 110132388

(51) Int. Cl.
| | |
|---|---|
| H01L 21/00 | (2006.01) |
| H01L 21/322 | (2006.01) |
| H01L 29/20 | (2006.01) |
| H01L 29/205 | (2006.01) |
| H01L 29/66 | (2006.01) |
| H01L 29/778 | (2006.01) |

(52) U.S. Cl.
CPC ...... *H01L 21/3228* (2013.01); *H01L 29/2003* (2013.01); *H01L 29/205* (2013.01); *H01L 29/66462* (2013.01); *H01L 29/7786* (2013.01)

(58) Field of Classification Search
CPC ............. H01L 21/3228; H01L 29/2003; H01L 29/205
See application file for complete search history.

(56) References Cited

U.S. PATENT DOCUMENTS

| | | | | |
|---|---|---|---|---|
| 6,740,853 | B1 * | 5/2004 | Johnson | H01L 21/67109 219/443.1 |
| 7,648,581 | B2 * | 1/2010 | Moriya | H01L 21/67034 134/1 |
| 7,913,702 | B2 * | 3/2011 | Moriya | H01L 21/67034 134/1 |
| 9,523,151 | B2 * | 12/2016 | Nasman | C23C 16/4483 |

(Continued)

FOREIGN PATENT DOCUMENTS

| | | | | |
|---|---|---|---|---|
| CN | 102414846 A | * | 4/2012 | ........... C23C 16/301 |
| CN | 103730518 A | * | 4/2014 | .......... H01L 29/0611 |

(Continued)

OTHER PUBLICATIONS

S. Latrach et al., "Trap states analysis in AlGaN/AlN/GaN and InAlN/AlN/GaN high electron mobility transistors," Current Applied Physics, vol. 17, Sep. 8, 2017, pp. 1601-1608.

*Primary Examiner* — Laura M Menz
(74) *Attorney, Agent, or Firm* — IPUSA, PLLC

(57) ABSTRACT

A method for manufacturing a semiconductor device includes the following steps. A channel layer and a barrier layer are sequentially formed on a substrate by an epitaxial process to form a semiconductor device. The channel layer includes a first III-V compound and the barrier layer includes a second III-V compound. The semiconductor device is disposed within a cavity. A high-pressure fluid is introduced into the cavity to perform a passivation treatment (Continued)

on defects of the semiconductor device with the high-pressure fluid. The high-pressure fluid is doped with a compound composed of at least one of nitrogen, oxygen, and fluorine.

19 Claims, 13 Drawing Sheets

(56) References Cited

U.S. PATENT DOCUMENTS

| | | | |
|---|---|---|---|
| 11,600,708 B2 * | 3/2023 | Liao | H01L 29/66462 |
| 2006/0102207 A1 * | 5/2006 | Moriya | B08B 7/0035 |
| | | | 134/184 |
| 2010/0071732 A1 * | 3/2010 | Moriya | H01L 21/67034 |
| | | | 134/105 |
| 2014/0239309 A1 | 8/2014 | Ramdani et al. | |
| 2015/0240355 A1 * | 8/2015 | Nasman | C23C 16/4483 |
| | | | 239/136 |
| 2019/0115443 A1 | 4/2019 | Ramdani | |
| 2019/0131416 A1 * | 5/2019 | Chiu | H01L 29/66462 |
| 2020/0127157 A1 | 4/2020 | Mann et al. | |
| 2021/0118984 A1 * | 4/2021 | Shimizu | H01L 21/02178 |
| 2021/0184011 A1 * | 6/2021 | Chiu | H01L 29/42364 |
| 2023/0064487 A1 * | 3/2023 | Li | H01L 29/205 |

FOREIGN PATENT DOCUMENTS

| | | | | |
|---|---|---|---|---|
| CN | 103745991 A | * | 4/2014 | H01L 29/0634 |
| CN | 104538447 A | * | 4/2015 | H01L 29/1033 |
| CN | 105655452 A | * | 6/2016 | |
| CN | 105742348 A | | 7/2016 | |
| CN | 106783945 A | * | 5/2017 | |
| CN | 111509041 A | * | 8/2020 | H01L 21/02164 |
| CN | 112701200 A | * | 4/2021 | H01L 21/8252 |
| CN | 113990948 A | * | 1/2022 | |
| CN | 115732324 A | * | 3/2023 | H01L 21/3228 |
| CN | 112701200 B | * | 4/2024 | H01L 21/8252 |
| TW | 200305213 A | | 10/2003 | |
| TW | 200913058 A | | 3/2009 | |
| TW | 201133559 A | | 10/2011 | |
| WO | WO-2013030171 A1 | * | 3/2013 | H01L 31/1864 |
| WO | WO-2017111826 A1 | * | 6/2017 | |
| WO | WO-2019096528 A1 | * | 5/2019 | H01L 23/3171 |
| WO | WO-2020017437 A1 | * | 1/2020 | H01L 21/2654 |
| WO | WO-2022116915 A1 | * | 6/2022 | H01L 29/0603 |
| WO | WO-2023249450 A1 | * | 12/2023 | H01L 21/02664 |
| WO | WO-2024005610 A1 | * | 1/2024 | H01L 29/66969 |

* cited by examiner

METHOD FOR MANUFACTURING SEMICONDUCTOR DEVICE

RELATED APPLICATIONS

This application claims priority to Taiwan Application Serial Number 110132388, filed Sep. 1, 2021, which is herein incorporated by reference.

BACKGROUND

Field of Invention

The present invention relates to a method for manufacturing a semiconductor device. More particularly, the present invention relates to a low temperature passivation method for the semiconductor device.

Description of Related Art

Gallium nitride (GaN) is an ideal material for power components because of its characteristics such as wide energy gap and high electron mobility. Traditionally, due to the lattice mismatch, when a GaN layer is epitaxially grown on a silicon substrate, the GaN layer may easily formed with numerous dislocation defects. Furthermore, a buffer layer, a channel layer, and a barrier layer are formed during the epitaxial process to form a two-dimensional electron gas, and thus defects may also generated on the interfaces between the said layers. The aforementioned defects may increase the leakage current of the device and decrease the on-state current of the device, and lead to poor reliability of the device.

SUMMARY

The present invention provides a method for manufacturing a semiconductor device. The said method includes: forming a channel layer and a barrier layer on a substrate, sequentially, by an epitaxial process to form the semiconductor device; disposing the semiconductor device within a cavity; and introducing a high-pressure fluid into the cavity to perform a passivation treatment on defects of the semiconductor device with the high-pressure fluid. The channel layer includes a first III-V compound and the barrier layer includes a second III-V compound. The high-pressure fluid is doped with a compound composed of at least one of nitrogen, oxygen, and fluorine.

In accordance with one or more embodiments of the invention, the said method further includes: forming a p-type III-V compound layer on the barrier layer. The passivation treatment is performed before or after the p-type III-V compound layer is formed, or the passivation treatment is performed before and after the p-type III-V compound layer is formed.

In accordance with one or more embodiments of the invention, the said method further includes: forming a dielectric layer on the p-type III-V compound layer. The passivation treatment is performed before or after the dielectric layer is formed, or the passivation treatment is performed before and after the dielectric layer is formed.

In accordance with one or more embodiments of the invention, the said method further includes: forming a gate layer on the p-type III-V compound layer. The passivation treatment is performed before or after the gate layer is formed, or the passivation treatment is performed before and after the gate layer is formed.

In accordance with one or more embodiments of the invention, the said method further includes: forming a gate layer on the barrier layer. The passivation treatment is performed before or after the gate layer is formed, or the passivation treatment is performed before and after the gate layer is formed.

In accordance with one or more embodiments of the invention, the said method further includes: forming a dielectric layer on the barrier layer. The passivation treatment is performed before or after the dielectric layer is formed, or the passivation treatment is performed before and after the dielectric layer is formed.

In accordance with one or more embodiments of the invention, the said method further includes: forming a gate layer on the dielectric layer. The passivation treatment is performed before or after the gate layer is formed, or the passivation treatment is performed before and after the gate layer is formed.

In accordance with one or more embodiments of the invention, the said method further includes: forming a first insulating layer on the barrier layer; forming a source/drain metal layer on the channel layer, the barrier layer, and the first insulating layer; forming a second insulating layer on the first insulating layer and the source/drain metal layer; forming a p-type III-V compound layer on the barrier layer and the second insulating layer; and forming a gate layer on the p-type III-V compound layer. The passivation treatment is performed before or after the source/drain metal layer is formed, or the passivation treatment is performed before and after the source/drain metal layer is formed.

In accordance with one or more embodiments of the invention, the said method further includes: forming an insulating layer on the barrier layer and the gate layer; and forming a source/drain metal layer on the channel layer. The passivation treatment is performed before or after the source/drain metal layer is formed, or the passivation treatment is performed before and after the source/drain metal layer is formed. The passivation treatment is performed before or after the insulating layer is formed, or the passivation treatment is performed before and after the insulating layer is formed.

In accordance with one or more embodiments of the invention, the said method further includes: forming an insulating layer on the dielectric layer and the gate layer; and forming a source/drain metal layer on the channel layer. The passivation treatment is performed before or after the source/drain metal layer is formed, or the passivation treatment is performed before and after the source/drain metal layer is formed. The passivation treatment is performed before or after the insulating layer is formed, or the passivation treatment is performed before and after the insulating layer is formed.

In accordance with one or more embodiments of the invention, the compound doped by the high-pressure fluid is selected from a group consisting of: $O_2$, $N_2$, NO, $N_2O$, $NO_2$, $NH_3$, $NH_4OH$, $NH_4CL$, $NH_4F$, $NH_4I$, $NH_4Br$, $(NH_4)_2SO_4$, $NH_4HSO_4$, $NH_4NO_3$, $H_2O$, $H_2O_2$, $D_2O$, $CO(NH_2)_2$, $(NH_4)_2CO_3$, $NH_4HCO_3$, $CO_2$, CO, $SO_2$, $NF_3$, $CF_4$, HF, $WF_6$, $SF_6$, $F_2$, $COF_2$, $CLF_3$, $XeF_3$, $MOF_6$, $TeF_6$, $PF_3$, $PF_5$, $AsF_3$, $AsF_5$, $CH_3F$, $CH_2F_2$, $CHF_3$, $C_2HF_5$, $C_2F_6$, $C_3F_8$, $C_4F_6$, $C_4F_8$, $C_5HF_7$, $C_5F_8$, $SiF_4$, $BF_3$, $GeF_4$, CCLF3, C2CLF5, CHFCL2, and a combination thereof.

In accordance with one or more embodiments of the invention, the high-pressure fluid is utilized to perform the passivation treatment on material defects in the semiconductor device. An element concentration of elements introduced by the passivation treatment in a region material of the material defects is from 10 ppb to 1%.

In accordance with one or more embodiments of the invention, the high-pressure fluid is utilized to perform the passivation treatment on material defects in the semiconductor device. An element concentration of elements introduced by the passivation treatment in a material of the semiconductor device is from $1.0 \times 10^{15}$ atom/cm$^3$ to $1.0 \times 10^{21}$ atom/cm$^3$.

In accordance with one or more embodiments of the invention, a pressure within the cavity is from 10 atmospheres to 300 atmospheres, and a temperature within the cavity is below 850° C.

In accordance with one or more embodiments of the invention, a pressure within the cavity is from 50 atmospheres to 250 atmospheres, and a temperature within the cavity is from 100° C. to 600° C.

In accordance with one or more embodiments of the invention, the passivation treatment with the high-pressure fluid is anisotropic.

In accordance with one or more embodiments of the invention, the first III-V compound is gallium nitride (GaN) and the second III-V compound is aluminum gallium nitride (AlGaN).

In accordance with one or more embodiments of the invention, the p-type III-V compound layer is a layer made by p-type gallium nitride (p-GaN).

In accordance with one or more embodiments of the invention, the defects of the semiconductor device include at least of: interface defects between the channel layer and the barrier layer, lattice defects, etching defects generated due to etching, and heterojunction defects generated due to heterojunction between material stacks.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present invention are further described in detail below with reference to the accompanying drawings, however, the embodiments described are not intended to limit the present invention and it is not intended for the description of operation to limit the order of implementation. The using of "first", "second", "third", etc. in the specification should be understood for identify units or data described by the same terminology, but are not referred to particular order or sequence.

Figure 1:
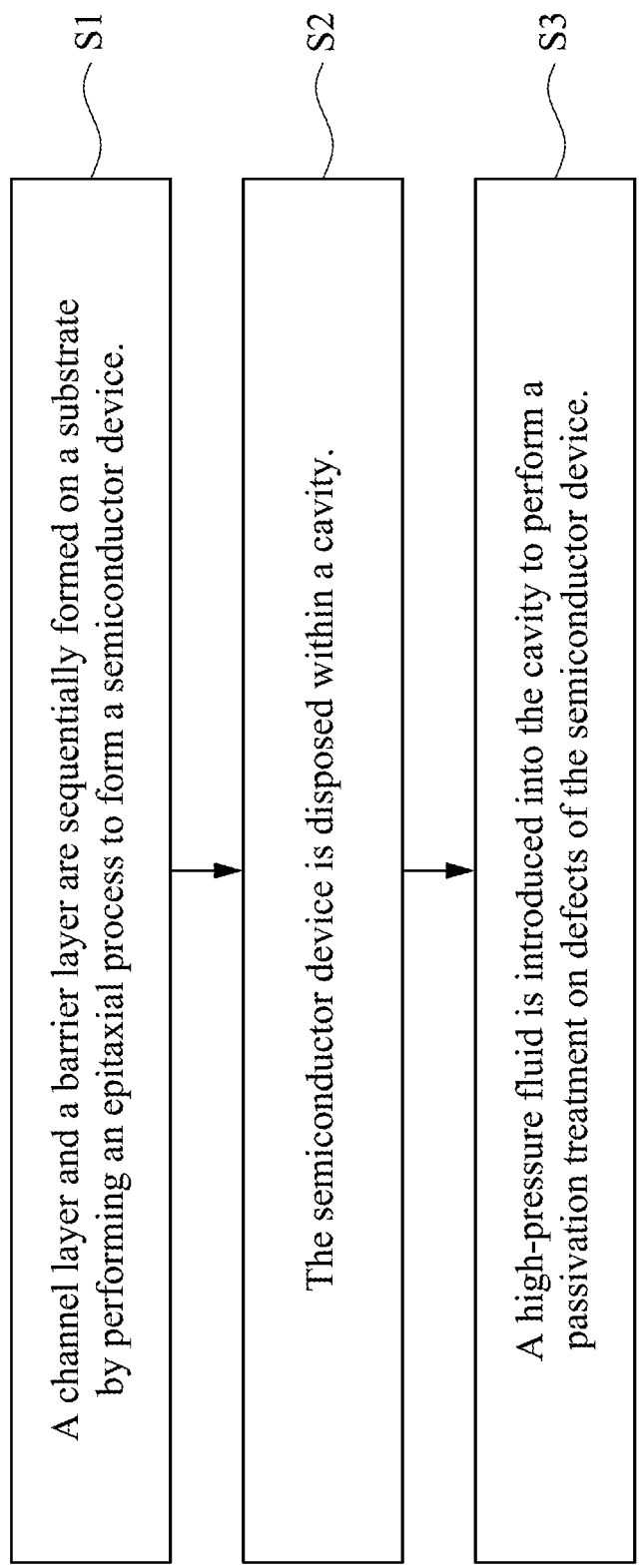
FIG. 1 illustrates a flow chart of method for manufacturing a semiconductor device according to some embodiments of the present invention.
Figure 2:
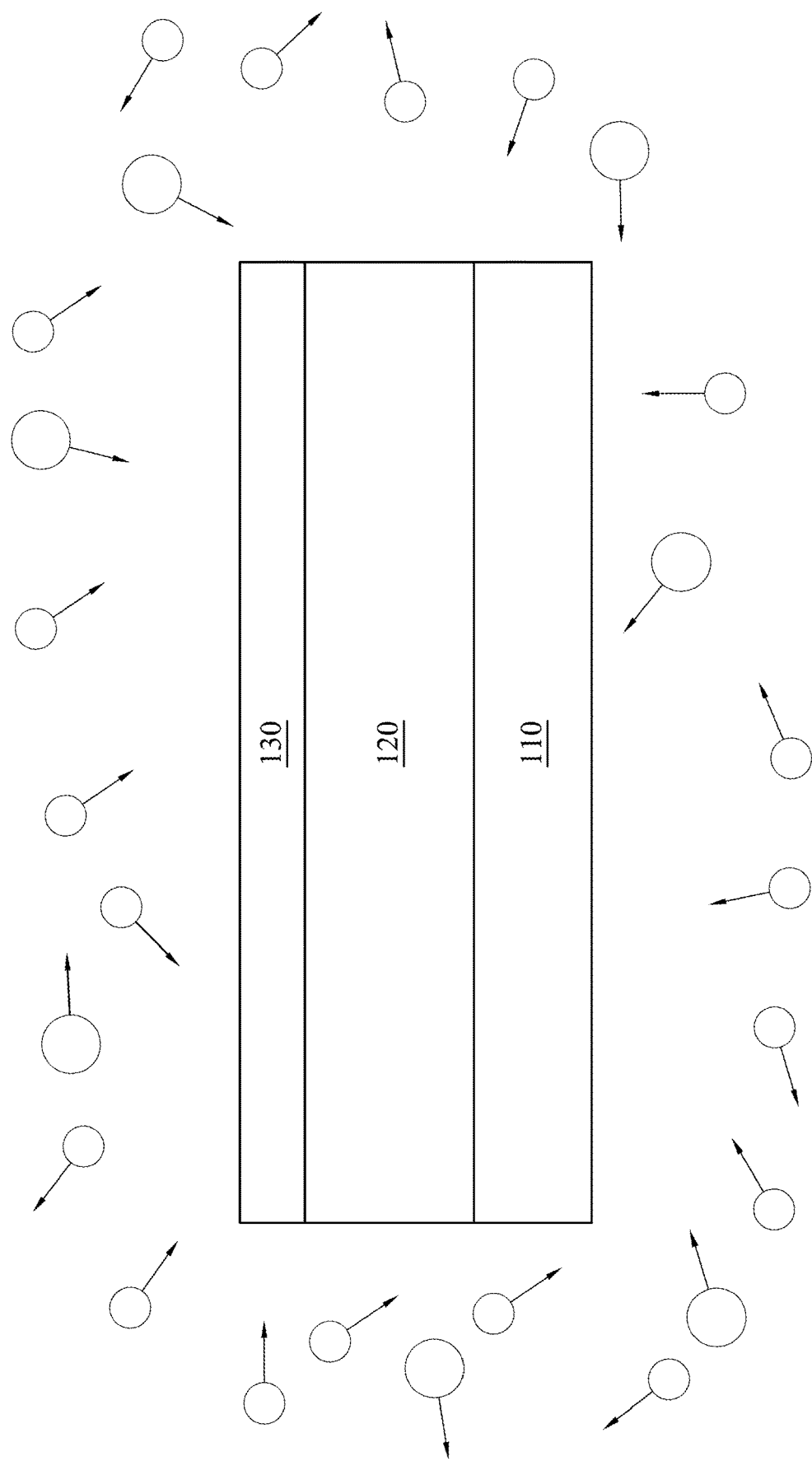
FIG. 2 illustrates a schematic diagram showing a passivation process of the semiconductor device according to a first embodiment of the present invention.

FIG. 1 illustrates a flow chart of method for manufacturing a semiconductor device according to some embodiments of the present invention. FIG. 2 illustrates a schematic diagram showing a passivation process of the semiconductor device according to a first embodiment of the present invention. As shown in FIG. 1 and FIG. 2, in a step S1 of the method for manufacturing a semiconductor device, a channel layer 120 and a barrier layer 130 are sequentially formed on a substrate 110 by performing an epitaxial process to form a semiconductor device.

In some embodiments of the present invention, the material of the substrate 110 may be sapphire, silicon (Si), aluminum nitride (AlN), silicon carbide (SiC) or gallium nitride (GaN), etc., but the invention is not limited thereto. In some embodiments of the present invention, the substrate 110 may also be selectively doped dopant therein to form a conductive substrate or a non-conductive substrate. For example, when the material of the substrate 110 is silicon (Si), the dopant may be boron (P) or magnesium (Mg).

In some embodiments of the present invention, the channel layer 120 includes a first III-V compound. For example, the first III-V compound is gallium nitride (GaN), etc., but the invention is not limited thereto. The channel layer 120 may be a doped layer or an undoped layer, and a thickness of the channel layer 120 is at least 500 nm.

In some embodiments of the present invention, the barrier layer 130 includes a second III-V compound. For example, the second III-V compound is aluminum gallium nitride (AlGaN), etc., but the invention is not limited thereto. The element proportion of Al is not larger than a half of the element proportion of Ga, such as $Al_{0.2}Ga_{0.8}N$ or $Al_{0.3}Ga_{0.7}N$, etc. The energy gap of the barrier layer 130 is higher than the energy gap of the channel layer 120, and the lattice constant of the barrier layer 130 is smaller than the lattice constant of the channel layer 120, and a thickness of the barrier layer 130 from 10 nm to 30 nm. Since the barrier layer 130 has the characteristic of spontaneous polarization, and due the mismatch between the lattice constant of the channel layer 120 and the lattice constant of the barrier layer 130 to form piezoelectric polarization, a two-dimensional electron gas may be formed at the junction between the channel layer 120 and the barrier layer 130.

In some other embodiments of the present invention, before forming the channel layer 120, a buffer layer (not shown) may also be formed on the substrate 110 by the epitaxial process. The said buffer layer is used to make the epitaxial quality of the channel layer 120 and the barrier layer 130 formed thereon subsequently better. The buffer layer is used to reduce the difference between the lattice constant of the substrate 110 and the lattice constant of the channel layer 120 and to reduce the difference between the thermal expansion coefficient of the substrate 110 and the thermal expansion coefficient of the channel layer 120. For example, the material of the buffer layer is a group III-nitride material, such as III-V compound semiconductor material, and the buffer layer may have a single-layer structure or a multi-layer structure. The material of the buffer layer includes aluminum nitride (AlN), aluminum gallium nitride (AlGaN), indium gallium nitride (InGaN), aluminum indium nitride (AlInN), aluminum gallium indium nitride (AlGaInN), or a combination thereof.

In addition, in some other embodiments of the present invention, a nucleation layer (not shown) may also be disposed between the buffer layer and the substrate 110. The nucleation layer is used to make the epitaxial quality of the buffer layer and the channel layer 120 formed thereon subsequently better. The nucleation layer is used to further reduce the defect density of the channel layer 120, which is beneficial to the growth of subsequent film layers. The material of the nucleation layer is a III-V compound semiconductor material, such as aluminum nitride (AlN), gallium nitride (GaN), or aluminum gallium nitride (AlGaN), etc.

Specifically, the semiconductor device of the present invention is a compound semiconductor device.

In some embodiments of the present invention, as shown in FIG. 1, in a step S2 of the method for manufacturing the semiconductor device, the semiconductor device is disposed within a cavity. The said cavity has a reaction chamber, and the said cavity has a fluid inlet hole and a fluid outlet hole to facilitate introducing a high-pressure fluid into the said reaction chamber.

In some embodiments of the present invention, as shown in FIG. 1, in a step S3 of the method for manufacturing the semiconductor device, a high-pressure fluid is introduced into the cavity to perform a passivation treatment on defects of the semiconductor device with the high-pressure fluid. In some embodiments of the present invention, when the passivation treatment is performed, a pressure within the cavity is from 10 atmospheres to 300 atmospheres, and a temperature within the cavity is below 850° C. In some other embodiments of the present invention, when the passivation treatment is performed, a pressure within the cavity is from 50 atmospheres to 250 atmospheres, and a temperature within the cavity is from 100° C. to 600° C. Traditionally, the pressure for depositing the passivation layer is usually vacuum. In contrast, the present invention utilizes a high-pressure and low-temperature environment of the cavity to perform the passivation treatment on defects in the semiconductor device. Compared with a traditionally vacuum environment, the total amount of gas molecules in a high-pressure environment is more, so more gas molecules can diffuse into the semiconductor device, thereby performing the passivation treatment on material defects in the semiconductor device with the gas molecules.

In some embodiments of the present invention, the passivation treatment of the semiconductor device with the high-pressure fluid is anisotropic. For example, the passivation treatment is illustrated by two sizes of non-directional gas molecules shown in FIGS. 2 to 8 and FIGS. 9A to 9C.

In some embodiments of the present invention, the high-pressure fluid is doped with a compound consisting of at least one of nitrogen, oxygen, and fluorine, such that the high-pressure fluid doped with the said compound acts as a co-solvent. Specifically, the said compound doped by the high-pressure fluid is selected from a group consisting of: $O_2$, $N_2$, NO, $N_2O$, $NO_2$, $NH_3$, $NH_4OH$, $NH_4CL$, $NH_4F$, $NH_4I$, $NH_4Br$, $(NH_4)_2SO_4$, $NH_4HSO_4$, $NH_4NO_3$, $H_2O$, $H_2O_2$, $D_2O$, $CO(NH_2)_2$, $(NH_4)_2CO_3$, $NH_4HCO_3$, $CO_2$, CO, $SO_2$, $NF_3$, $CF_4$, HF, $WF_6$, $SF_6$, $F_2$, $COF_2$, $CLF_3$, $XeF_3$, $MOF_6$, $TeF_6$, $PF_3$, $PF_5$, $AsF_3$, $AsF_5$, $CH_3F$, $CH_2F_2$, $CHF_3$, $C_2HF_5$, $C_2F_6$, $C_3F_8$, $C_4F_6$, $C_4F_8$, $C_5HF_7$, $C_5F_8$, $SiF_4$, $BF_3$, $GeF_4$, CCLF3, C2CLF5, CHFCL2, and a combination thereof. The proportion of the selected compounds in the said group can be adjusted according to actual needs. In some embodiments of the present invention, the high-pressure fluid is utilized to perform the passivation treatment on material defects, and an element concentration of elements introduced by the passivation treatment in a material of the semiconductor device is from $1.0 \times 10^{15}$ atom/cm³ to $1.0 \times 10^{21}$ atom/cm³. In some embodiments of the present invention, the high-pressure fluid is utilized to perform the passivation treatment on material defects, and the said material defects include defects within bulk and interface defects. An element concentration of elements introduced by the passivation treatment in a region material of the material defects may be from 10 ppb to 10 ppm, from 10 ppb to 1000 PPM, from 10 ppb to 0.1%, or from 10 ppb to 1%.

In some embodiments of the present invention, defects in the semiconductor device repaired by the passivation treatment include at least one of: interface defects between the channel layer 120 and the barrier layer 130, lattice defects, etching defects generated due to etching, and heterojunction defects generated due to heterojunction between material stacks. In some embodiments of the present invention, since the characteristics of the high-pressure fluid (e.g., the density, the diffusivity, the viscosity, etc.) are between the characteristics of the liquid and the characteristics of the gas, comparing with the high permeability and no solubility of the gas and comparing with the low permeability and extremely high solubility of the liquid, the high-pressure fluid may have both high permeability and high solubility. Therefore, the lattice defect passivation, the interface defect passivation and the thin film modification (such as reducing leakage current, but not limited thereto) may be perform on the semiconductor device. The above-mentioned defects may lead to dangling bonds or unstable bonds, and the passivation treatment means that the said defects react with the elements introduced by the passivation treatment with the high-pressure fluid, thereby forming relatively stable bonds.

Figure 3:
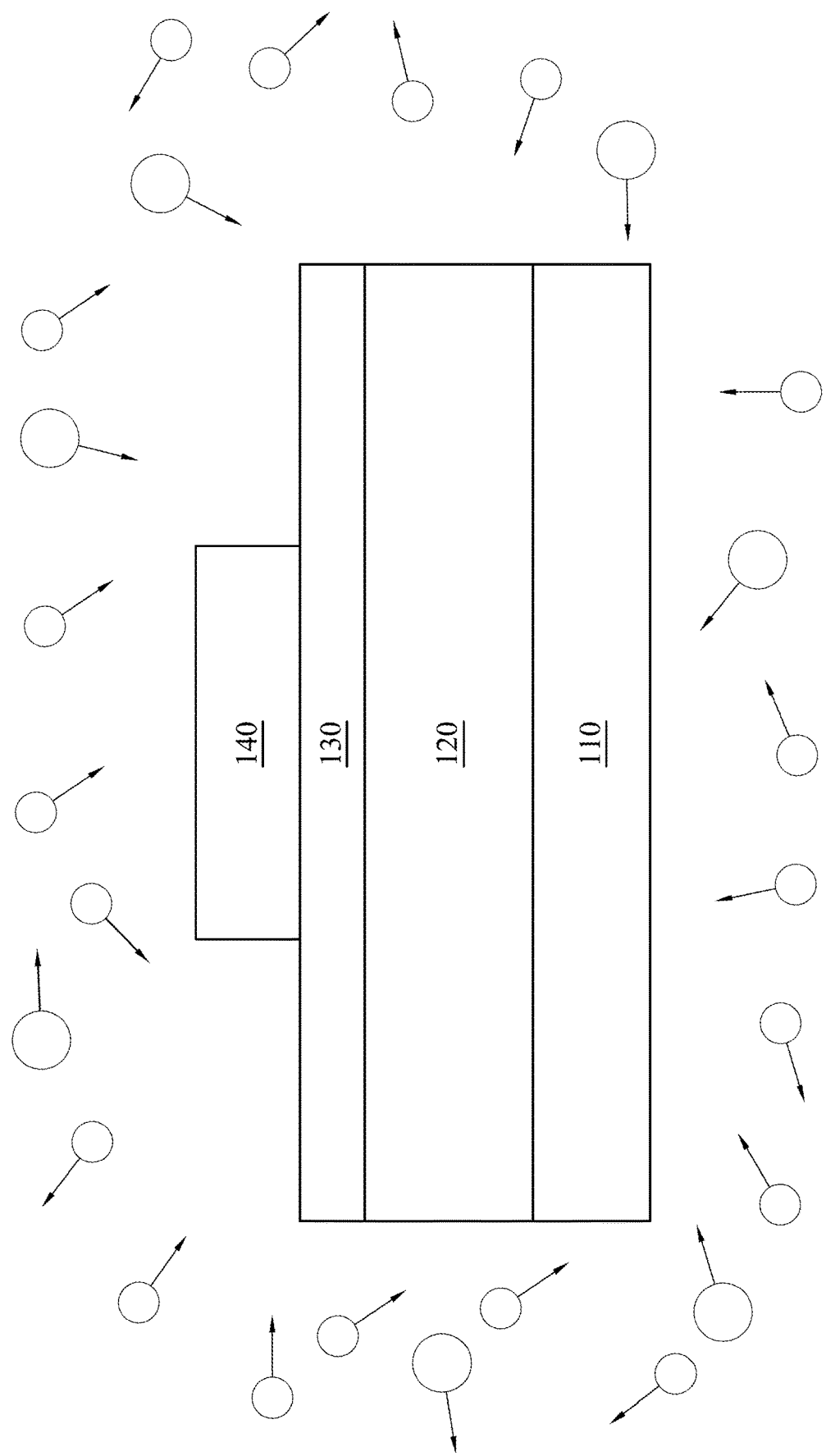
FIG. 3 illustrates a schematic diagram showing a passivation process of the semiconductor device according to a second embodiment of the present invention.

FIG. 3 illustrates a schematic diagram showing a passivation process of the semiconductor device according to a second embodiment of the present invention. In the second embodiment of the present invention, the method for manufacturing a semiconductor device further includes: forming a p-type III-V compound layer 140 on the barrier layer 130. For example, the p-type III-V compound layer 140 is a gallium nitride layer with p-type conductivity (i.e., the p-GaN layer), and a thickness of the said p-GaN layer is from 50 nm to 150 nm, but the present invention is not limited thereto. The energy gap of the p-type III-V compound layer 140 is smaller than the energy gap of the barrier layer 130, and thus the difference in work function between the p-type III-V compound layer 140 and the barrier layer 130 may be utilized to adjust the threshold voltage for conducting the semiconductor device.

In the second embodiment of the present invention, the passivation treatment is performed before or after the p-type III-V compound layer 140 is formed, or the passivation treatment is performed before and after the p-type III-V compound layer 140 is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device). After the passivation treatment is performed, defects in the material of the semiconductor device may be reduced, and the material performance of the semiconductor device may be improved.

Figure 4:
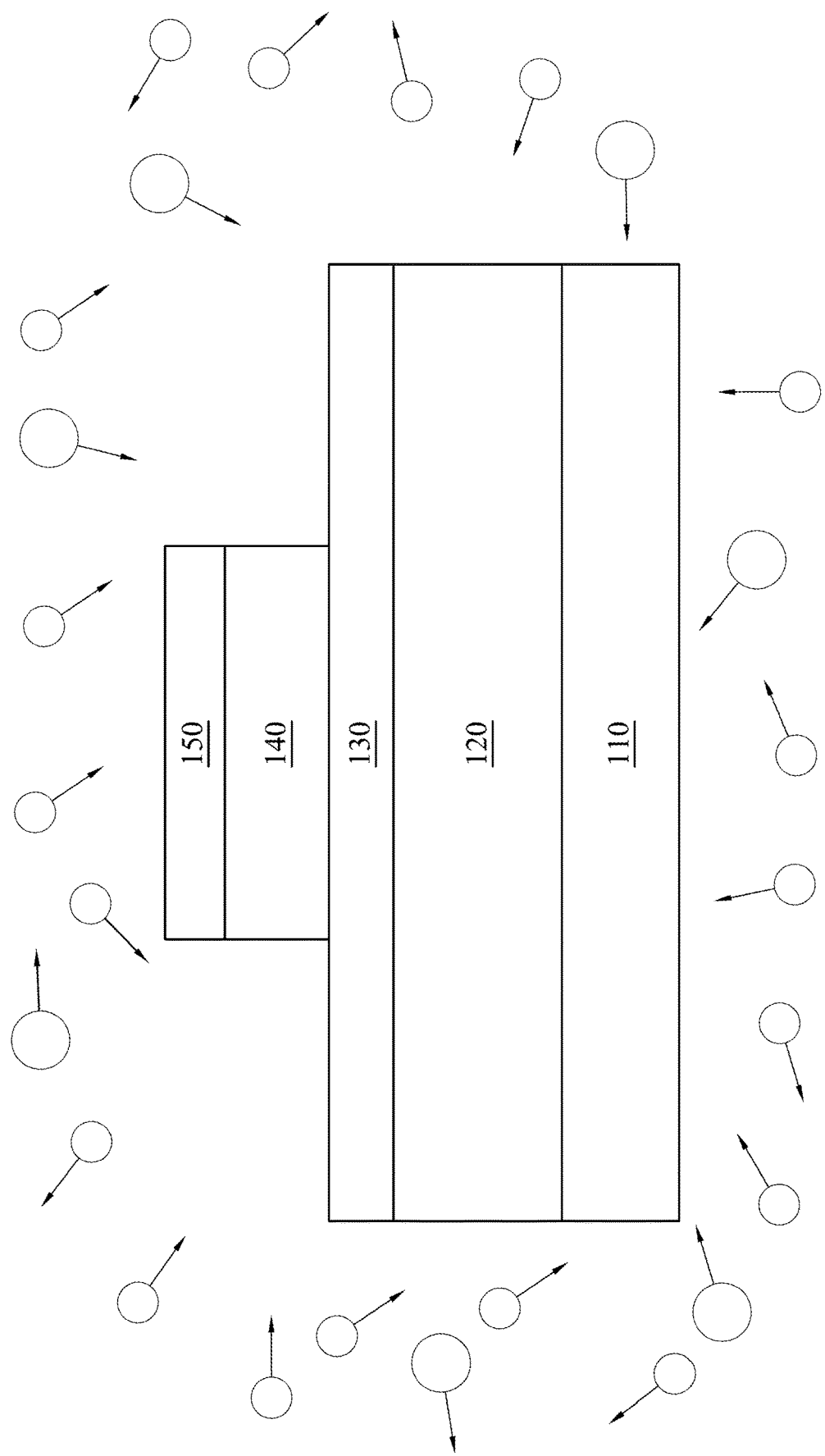
FIG. 4 illustrates a schematic diagram showing a passivation process of the semiconductor device according to a third embodiment of the present invention.

FIG. 4 illustrates a schematic diagram showing a passivation process of the semiconductor device according to a third embodiment of the present invention. In the third embodiment of the present invention, the method for manufacturing a semiconductor device further includes: forming a p-type III-V compound layer 140 on the barrier layer 130; and forming a dielectric layer 150 on the p-type III-V compound layer 140. For example, the p-type III-V compound layer 140 is a gallium nitride layer with p-type conductivity (i.e., the p-GaN layer), but the present invention is not limited thereto. The material of the dielectric layer 150 includes a dielectric material and may have a single-layer structure or a multi-layer structure, and a thickness of the dielectric layer 150 is from 10 nm to 100 nm. The dielectric material of the dielectric layer 150 includes aluminum oxide ($Al_2O_3$), silicon nitride ($Si_3N_4$), silicon oxide, aluminum nitride (AlN), or a combination thereof, but the present invention is not limited thereto.

In the third embodiment of the present invention, the passivation treatment is performed before or after the dielectric layer 150 is formed, or the passivation treatment is performed before and after the dielectric layer 150 is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 5:
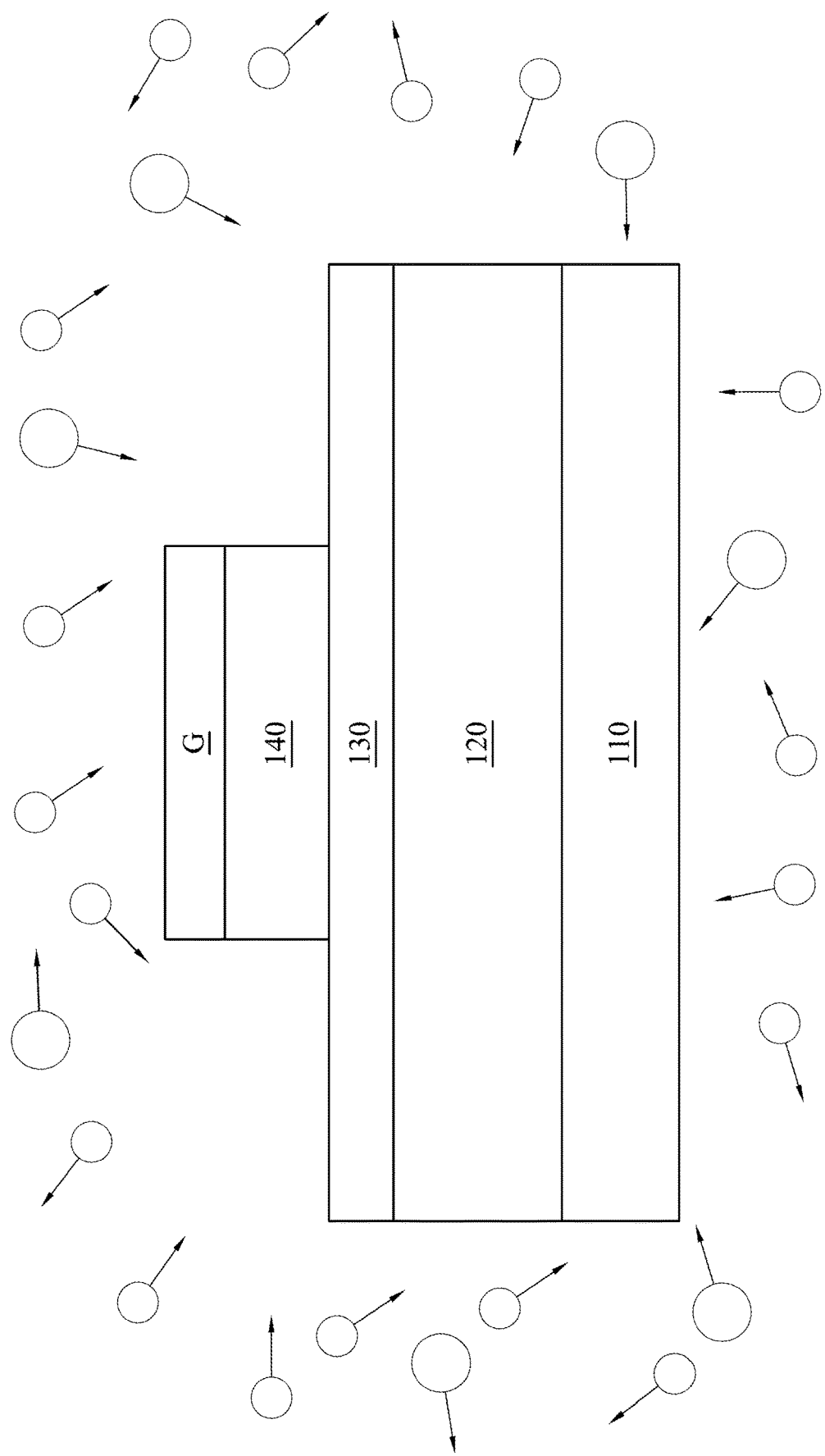
FIG. 5 illustrates a schematic diagram showing a passivation process of the semiconductor device according to a fourth embodiment of the present invention.

FIG. 5 illustrates a schematic diagram showing a passivation process of the semiconductor device according to a fourth embodiment of the present invention. In the fourth embodiment of the present invention, the method for manufacturing a semiconductor device further includes: forming a p-type III-V compound layer 140 on the barrier layer 130; and forming a gate layer G on the p-type III-V compound layer 140. For example, the p-type III-V compound layer 140 is a gallium nitride layer with p-type conductivity (i.e., the p-GaN layer), but the present invention is not limited thereto. The material of the gate layer G may include metal, metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof), metal silicide (e.g. tungsten silicide ($WSi_x$)) or other materials that may form a Schottky contact with the III-V compound semiconductor. For example, the gate layer G may be formed by utilizing an etching process or a lift off process.

In the fourth embodiment of the present invention, the passivation treatment is performed before or after the gate layer G is formed, or the passivation treatment is performed before and after the gate layer G is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 6:
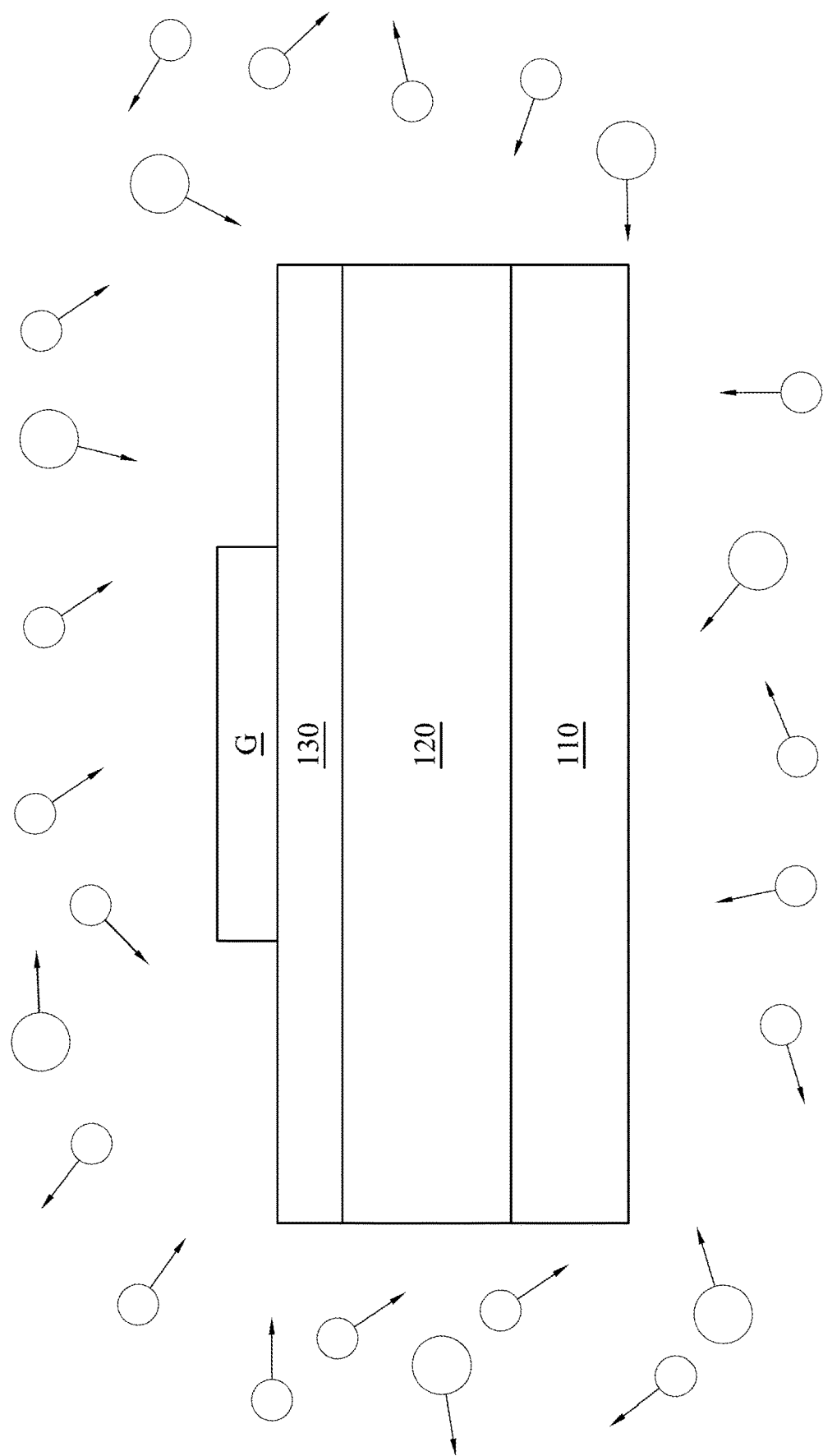
FIG. 6 illustrates a schematic diagram showing a passivation process of the semiconductor device according to a fifth embodiment of the present invention.

FIG. 6 illustrates a schematic diagram showing a passivation process of the semiconductor device according to a fifth embodiment of the present invention. In the fifth embodiment of the present invention, the method for manufacturing a semiconductor device further includes: forming a gate layer G on the barrier layer 130. The material of the gate layer G may include metal, metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof), metal silicide (e.g. tungsten silicide ($WSi_x$)) or other materials that may form a Schottky contact with the III-V compound semiconductor. For example, the gate layer G may be formed by utilizing an etching process or a lift off process.

In the fifth embodiment of the present invention, the passivation treatment is performed before or after the gate layer G is formed, or the passivation treatment is performed before and after the gate layer G is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 7:
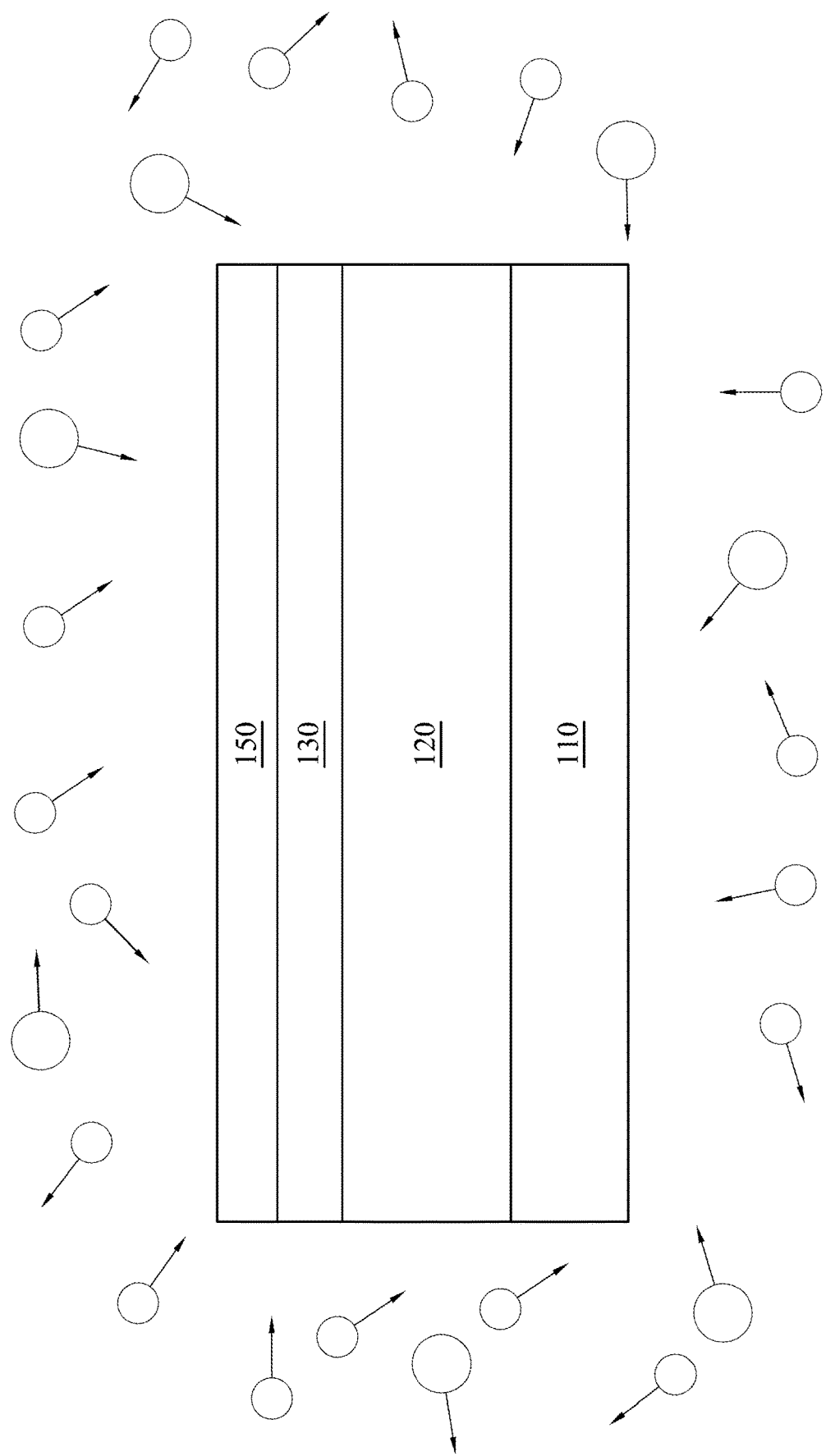
FIG. 7 illustrates a schematic diagram showing a passivation process of the semiconductor device according to a sixth embodiment of the present invention.

FIG. 7 illustrates a schematic diagram showing a passivation process of the semiconductor device according to a sixth embodiment of the present invention. In the sixth embodiment of the present invention, the method for manufacturing a semiconductor device further includes: forming a dielectric layer 150 on the barrier layer 130. The material of the dielectric layer 150 includes a dielectric material and may have a single-layer structure or a multi-layer structure. The dielectric material of the dielectric layer 150 includes aluminum oxide ($Al_2O_3$), silicon nitride ($Si_3N_4$), silicon oxide, aluminum nitride (AlN), or a combination thereof, but the present invention is not limited thereto.

In the sixth embodiment of the present invention, the passivation treatment is performed before or after the dielectric layer 150 is formed, or the passivation treatment is performed before and after the dielectric layer 150 is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 8:
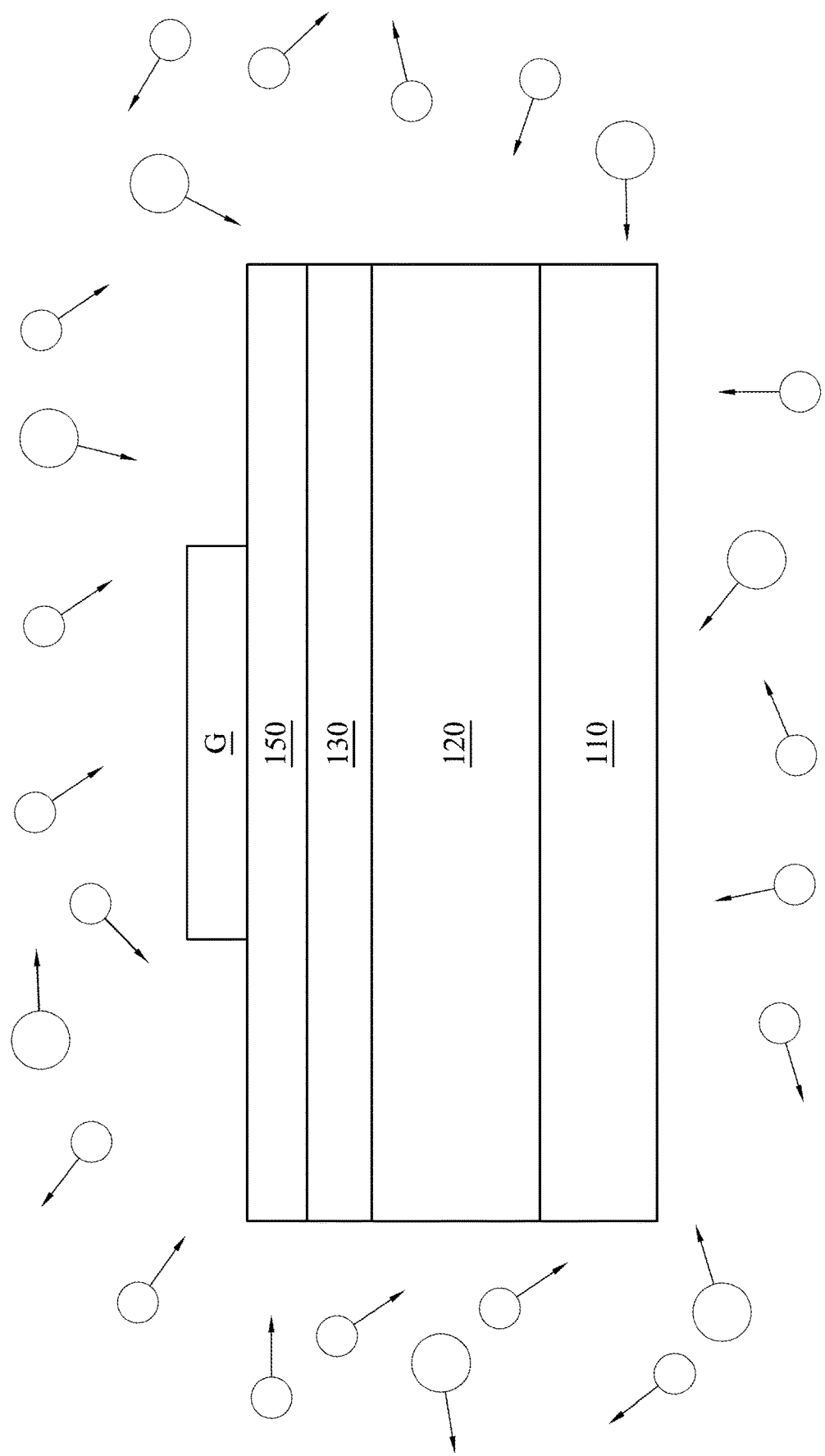
FIG. 8 illustrates a schematic diagram showing a passivation process of the semiconductor device according to a seventh embodiment of the present invention.

FIG. 8 illustrates a schematic diagram showing a passivation process of the semiconductor device according to a seventh embodiment of the present invention. In the seventh embodiment of the present invention, the method for manufacturing a semiconductor device further includes: forming a dielectric layer 150 on the barrier layer 130; and forming a gate layer G on the dielectric layer 150. The material of the dielectric layer 150 includes a dielectric material and may have a single-layer structure or a multi-layer structure. The dielectric material of the dielectric layer 150 includes aluminum oxide ($Al_2O_3$), silicon nitride ($Si_3N_4$), silicon oxide, aluminum nitride (AlN), or a combination thereof, but the present invention is not limited thereto. The material of the gate layer G may include metal, metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof), metal silicide (e.g. tungsten silicide ($WSi_x$)) or other materials that may form a Schottky contact with the III-V compound semiconductor. For example, the gate layer G may be formed by utilizing an etching process or a lift off process.

In the seventh embodiment of the present invention, the passivation treatment is performed before or after the gate layer G is formed, or the passivation treatment is performed before and after the gate layer G is formed. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 9A:
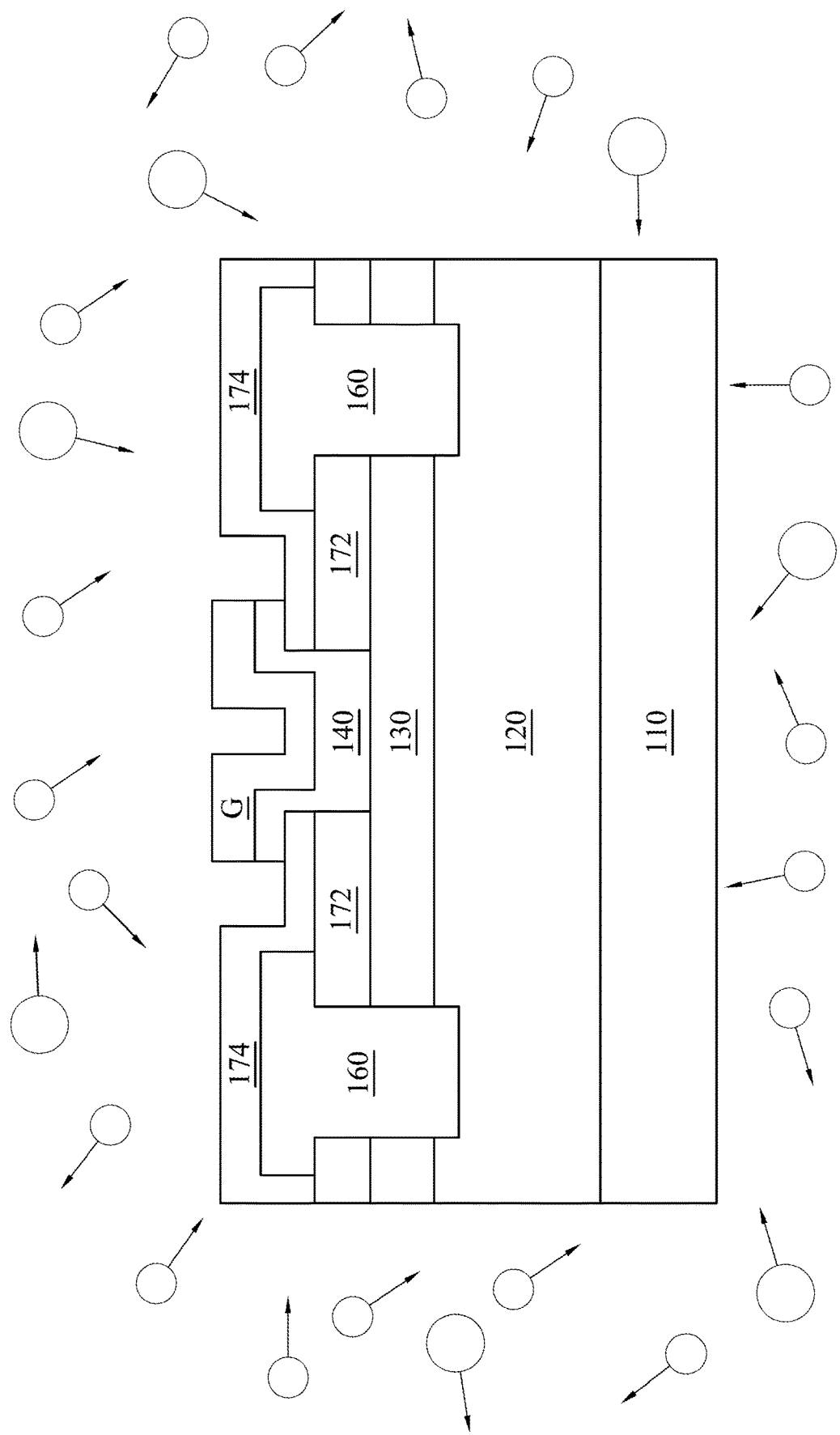
FIG. 9A illustrates a schematic diagram showing a passivation process of the semiconductor device according to an eighth embodiment of the present invention.

FIG. 9A illustrates a schematic diagram showing a passivation process of the semiconductor device according to an eighth embodiment of the present invention. In the eighth embodiment of the present invention, the method for manufacturing a semiconductor device further includes: forming an insulating layer 172 on the barrier layer 130; forming a source/drain (S/D) metal layer 160 on the channel layer 120, the barrier layer 130, and the insulating layer 172; forming an insulating layer 174 on the insulating layer 172 and the source/drain metal layer 160; forming a p-type III-V compound layer 140 on the barrier layer 130 and the insulating layer 174; and forming a gate layer G on the p-type III-V compound layer 140.

In the eighth embodiment of the present invention, for example, the p-type III-V compound layer 140 is a gallium nitride layer with p-type conductivity (i.e., the p-GaN layer), but the present invention is not limited thereto. In the eighth embodiment of the present invention, the material of the insulating layer 172 and the insulating layer 174 may be silicon dioxide ($SiO_2$), silicon nitride ($Si_3N_4$) or silicon oxynitride ($SiN_xO_y$). In the eighth embodiment of the present invention, the material of the source/drain metal layer 160 may include metal or metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof).

In the eighth embodiment of the present invention, the passivation treatment is performed before or after the source/drain metal layer 160 is formed, and the passivation treatment is performed before or after the protective layer (i.e., the insulating layer 172 or the insulating layer 174) covers the underlying layer. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 9B:
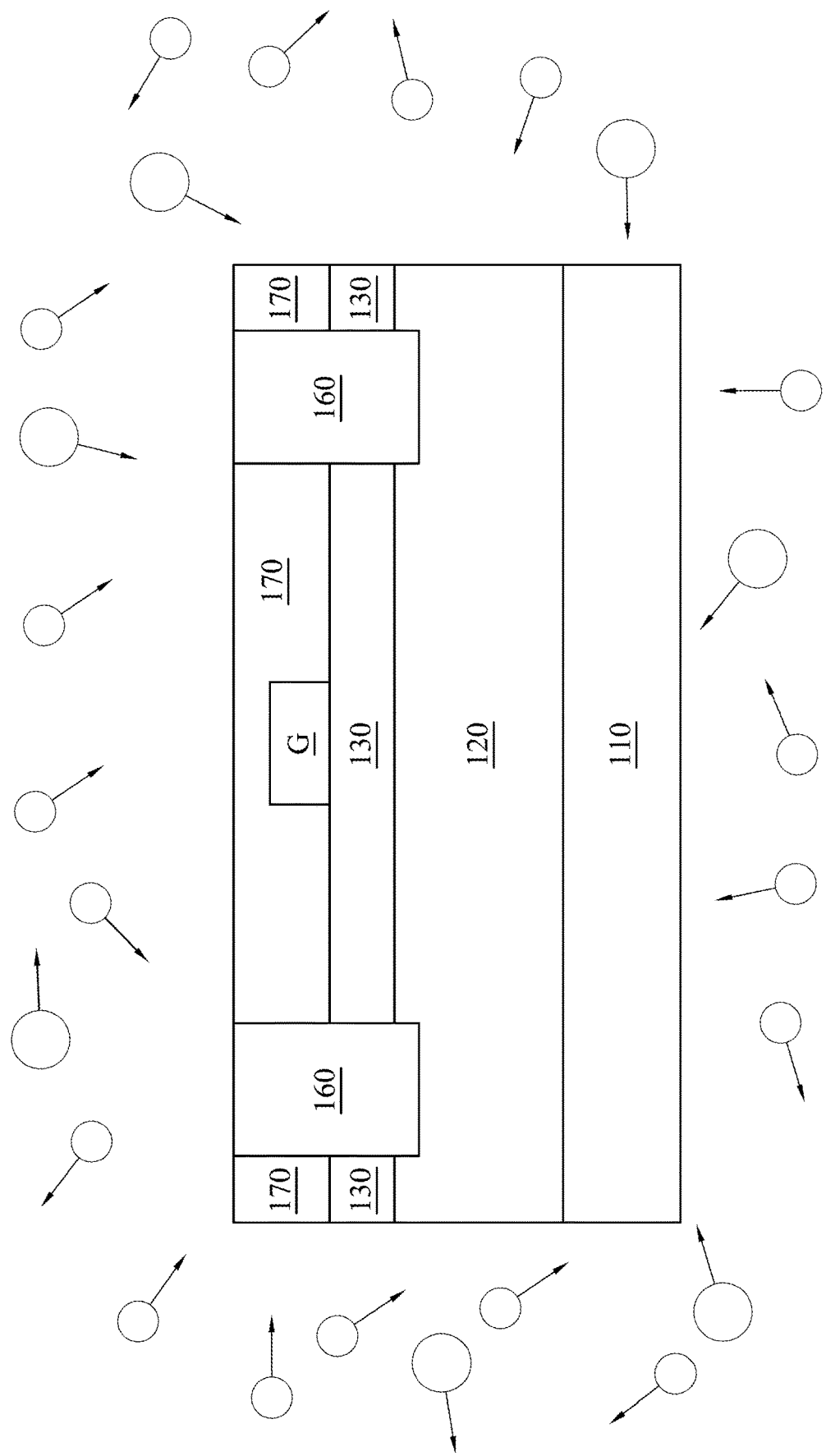
FIG. 9B illustrates a schematic diagram showing a passivation process of the semiconductor device according to a ninth embodiment of the present invention.

FIG. 9B illustrates a schematic diagram showing a passivation process of the semiconductor device according to a ninth embodiment of the present invention. In the ninth embodiment of the present invention, the method for manufacturing a semiconductor device further includes: forming a gate layer G on the barrier layer 130; forming an insulating layer 170 on the barrier layer 130 and the gate layer G; and forming a source/drain metal layer 160 on the channel layer 120.

In the ninth embodiment of the present invention, the material of the gate layer G may include metal, metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof), metal silicide (e.g. tungsten silicide ($WSi_x$)) or other materials that may form a Schottky contact with the III-V compound semiconductor. For example, the gate layer G may be formed by utilizing an etching process or a lift off process. In the ninth embodiment of the present invention, the material of the insulating layer 170 may be silicon dioxide ($SiO_2$), silicon nitride ($Si_3N_4$) or silicon oxynitride ($SiN_xO_y$). In the ninth embodiment of the present invention, the material of the source/drain metal layer 160 may include metal or metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof).

In the eighth embodiment of the present invention, the passivation treatment is performed before or after the source/drain metal layer 160 is formed, and the passivation treatment is performed before or after the protective layer (i.e., the insulating layer 170) covers the underlying layer. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

Figure 9C:
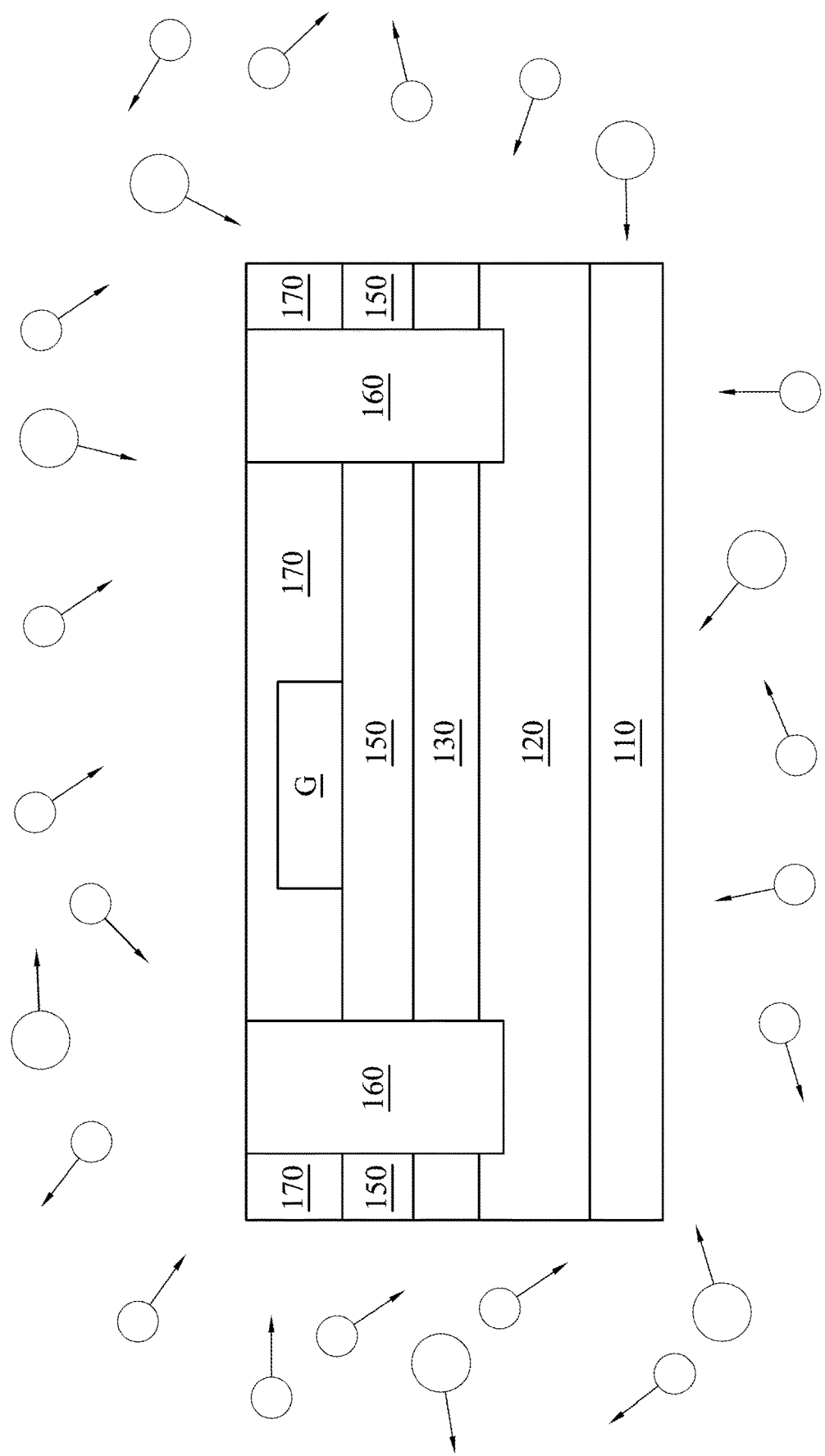
FIG. 9C illustrates a schematic diagram showing a passivation process of the semiconductor device according to a tenth embodiment of the present invention.

FIG. 9C illustrates a schematic diagram showing a passivation process of the semiconductor device according to a tenth embodiment of the present invention. In the tenth embodiment of the present invention, the method for manufacturing a semiconductor device further includes: forming a dielectric layer 150 on the barrier layer 130; forming a gate layer G on the dielectric layer 150; forming an insulating layer 170 on the dielectric layer 150 and the gate layer G; and forming a source/drain metal layer 160 on the channel layer 120.

In the tenth embodiment of the present invention, the material of the dielectric layer 150 includes a dielectric material and may have a single-layer structure or a multi-layer structure. The dielectric material of the dielectric layer 150 includes aluminum oxide ($Al_2O_3$), silicon nitride ($Si_3N_4$), silicon oxide, aluminum nitride (AlN), or a combination thereof, but the present invention is not limited thereto. In the tenth embodiment of the present invention, the material of the gate layer G may include metal, metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof), metal silicide (e.g. tungsten silicide ($WSi_x$)) or other materials that may form a Schottky contact with the III-V compound semiconductor. For example, the gate layer G may be formed by utilizing an etching process or a lift off process. In the tenth embodiment of the present invention, the material of the insulating layer 170 may be silicon dioxide ($SiO_2$), silicon nitride ($Si_3N_4$) or silicon oxynitride ($SiN_xO_y$). In the tenth embodiment of the present invention, the material of the source/drain metal layer 160 may include metal or metal nitride (e.g., tantalum (Ta), tantalum nitride (TaN), titanium (Ti), titanium nitride (TiN), tungsten (W), palladium (Pd), nickel (Ni), gold (Au), aluminum (Al), or a combination thereof).

In the tenth embodiment of the present invention, the passivation treatment is performed before or after the source/drain metal layer 160 is formed, and the passivation treatment is performed before or after the protective layer (i.e., the insulating layer 170) covers the underlying layer. Specifically, the passivation treatment of the present invention may be performed immediately after each layer is epitaxially formed (i.e., the passivation treatment is performed for each layer one by one), or the passivation treatment of the present invention may be performed after all layers are epitaxially formed (i.e., the passivation treatment is performed for the whole semiconductor device).

The passivation treatment of the present invention is a technique that aims at the defects in the epitaxial process and the film forming process, and the passivation treatment is for passivating the defects in the crystal lattice, the interface and the material by using a high-pressure fluid through a high-pressure and low-temperature environment. The best passivation timing is to perform the passivation treatment immediately after the defect occurs, thereby achieving the best improvement effect. In the semiconductor manufacturing process, after the epitaxy process is completed, the lattice defects may be formed inside the semiconductor device, and the interface defects may also be formed between the buffer layer, the channel layer, and the barrier layer. Therefore, the passivation treatment after the epitaxy process may effectively repair these defects. In addition, in the subsequent process, due to the etching defects generated due to etching, and heterojunction defects generated due to heterojunction between material stacks, it is necessary to introduce the passivation treatment in the subsequent device process after the epitaxial process to repair the said defects. The passivation process after the epitaxy process and the passivation process during the device manufacturing process may effectively reduce the defect density of the semiconductor device, increase the on-state current of the semiconductor device, reduce the leakage current of the semiconductor device, and improve the reliability of the semiconductor device. In some embodiments of the present invention, the interface defect density of the interface between the channel layer 120 and the barrier layer 130 of the semiconductor device is from $1\times10^{11}$ to $1\times10^{14}$ $cm^{-2}V^{-1}$ (refer to the literature: "Trap states analysis in AlGaN/AlN/GaN and InAlN/AlN/GaN high electron mobility transistors"; September 2017; Current Applied Physics 17(12)).

Figure 10:
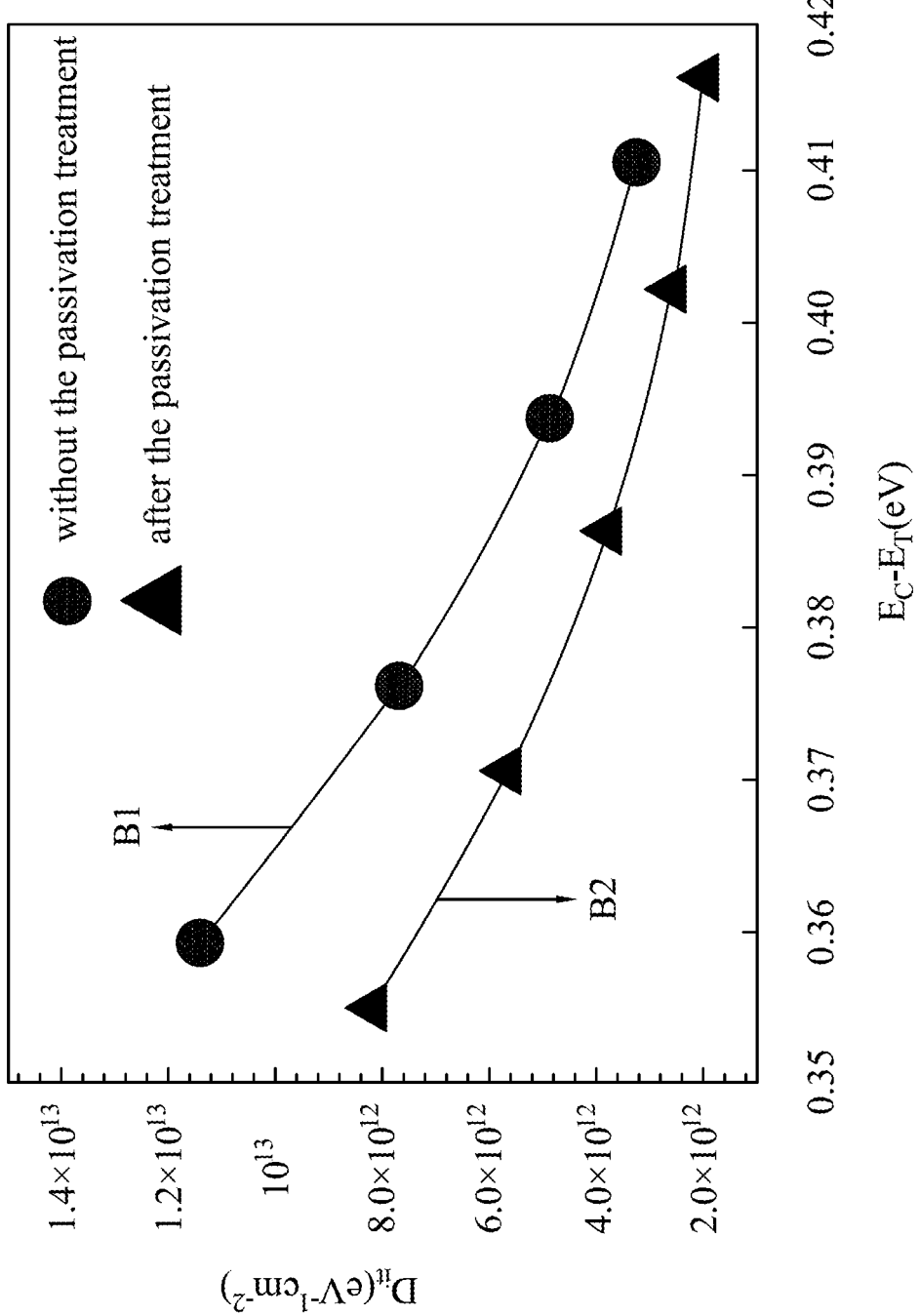
FIG. 10 illustrates a schematic diagram showing the interface defect density of the semiconductor device without passivation treatment and after passivation treatment according to some embodiments of the present invention.

FIG. 10 illustrates a schematic diagram showing the interface defect density of the semiconductor device without passivation treatment and after passivation treatment according to some embodiments of the present invention. The interface defect density is quantified as the density of interface trap ($D_{it}$), and the unit of the density of interface trap ($D_{it}$) is $cm^{-2}V^{-1}$. As shown in FIG. 10, the interface defect density of the semiconductor device after the passivation treatment are greatly reduced, which also means that the dangling bonds of the channel interface of the semiconductor device are greatly repaired.

Figure 11:
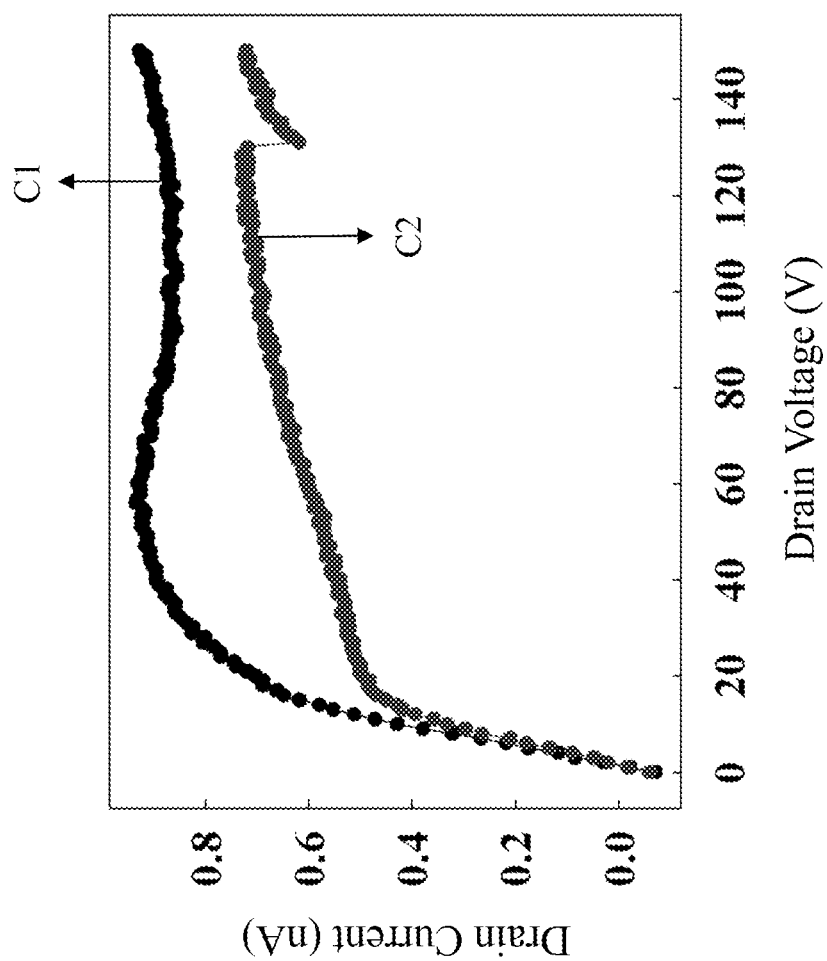
FIG. 11 illustrates a schematic diagram showing the relationship between the drain voltage and the drain current of the semiconductor device without passivation treatment and after passivation treatment according to some embodiments of the present invention.

FIG. 11 illustrates a schematic diagram showing the relationship between the drain voltage and the drain current of the semiconductor device without passivation treatment and after passivation treatment according to some embodiments of the present invention. FIG. 11 is a schematic diagram showing the relationship between the drain voltage (unit: volt (V)) and the drain current (unit: nanoamp (nA)) which are measured after the gate electrode of the semiconductor device is turned off. As shown in FIG. 11, the off-state leakage current (as shown by line C2) of the semiconductor device after the passivation treatment is reduced by about 30% to 40% compared with the leakage current (as shown by line C1) of the semiconductor device without the passivation treatment. The lower the leakage current of the semiconductor device, the lower the power consumption of the system, so the semiconductor device after the passivation treatment may improve the power consumption of the system.

From the above description, the present invention provides a method for manufacturing a semiconductor device. The said method aims at the defects generated during the epitaxial process and the thin film formation process, and a high-pressure fluid is utilized to passivate the lattice defects, the interface defects, and the defects in the material through a high-pressure and low-temperature environment.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor device, comprising:
    forming a channel layer and a barrier layer on a substrate, sequentially, by an epitaxial process to form the semiconductor device, wherein the channel layer includes a first III-V compound and the barrier layer includes a second III-V compound;
    disposing the semiconductor device within a cavity; and
    introducing a high-pressure fluid into the cavity to perform a passivation treatment on defects of the semiconductor device with the high-pressure fluid;
    wherein the high-pressure fluid is doped with a compound composed of at least one of nitrogen, oxygen, and fluorine.

2. The method of claim 1, further comprising:
    forming a p-type III-V compound layer on the barrier layer;
    wherein the passivation treatment is performed before or after the p-type III-V compound layer is formed, or the passivation treatment is performed before and after the p-type III-V compound layer is formed.

3. The method of claim 2, further comprising:
    forming a dielectric layer on the p-type III-V compound layer;
    wherein the passivation treatment is performed before or after the dielectric layer is formed, or the passivation treatment is performed before and after the dielectric layer is formed.

4. The method of claim 2, further comprising:
forming a gate layer on the p-type III-V compound layer;
wherein the passivation treatment is performed before or after the gate layer is formed, or the passivation treatment is performed before and after the gate layer is formed.

5. The method of claim 1, further comprising:
forming a gate layer on the barrier layer;
wherein the passivation treatment is performed before or after the gate layer is formed, or the passivation treatment is performed before and after the gate layer is formed.

6. The method of claim 1, further comprising:
forming a dielectric layer on the barrier layer;
wherein the passivation treatment is performed before or after the dielectric layer is formed, or the passivation treatment is performed before and after the dielectric layer is formed.

7. The method of claim 6, further comprising:
forming a gate layer on the dielectric layer;
wherein the passivation treatment is performed before or after the gate layer is formed, or the passivation treatment is performed before and after the gate layer is formed.

8. The method of claim 1, further comprising:
forming a first insulating layer on the barrier layer;
forming a source/drain metal layer on the channel layer, the barrier layer, and the first insulating layer;
forming a second insulating layer on the first insulating layer and the source/drain metal layer;
forming a p-type III-V compound layer on the barrier layer and the second insulating layer; and
forming a gate layer on the p-type III-V compound layer;
wherein the passivation treatment is performed before or after the source/drain metal layer is formed, or the passivation treatment is performed before and after the source/drain metal layer is formed.

9. The method of claim 5, further comprising:
forming an insulating layer on the barrier layer and the gate layer; and
forming a source/drain metal layer on the channel layer;
wherein the passivation treatment is performed before or after the source/drain metal layer is formed, or the passivation treatment is performed before and after the source/drain metal layer is formed;
wherein the passivation treatment is performed before or after the insulating layer is formed, or the passivation treatment is performed before and after the insulating layer is formed.

10. The method of claim 7, further comprising:
forming an insulating layer on the dielectric layer and the gate layer; and
forming a source/drain metal layer on the channel layer;
wherein the passivation treatment is performed before or after the source/drain metal layer is formed, or the passivation treatment is performed before and after the source/drain metal layer is formed;
wherein the passivation treatment is performed before or after the insulating layer is formed, or the passivation treatment is performed before and after the insulating layer is formed.

11. The method of claim 1, wherein the compound doped by the high-pressure fluid is selected from a group consisting of: $O_2$, $N_2$, NO, $N_2O$, $NO_2$, $NH_3$, $NH_4OH$, $NH_4CL$, $NH_4F$, $NH_4I$, $NH_4Br$, $(NH_4)_2SO_4$, $NH_4HSO_4$, $NH_4NO_3$, $H_2O$, $H_2O_2$, $D_2O$, $CO(NH_2)_2$, $(NH_4)_2CO_3$, $NH_4HCO_3$, $CO_2$, CO, $SO_2$, $NF_3$, $CF_4$, HF, $WF_6$, $SF_6$, $F_2$, $COF_2$, $CLF_3$, $XeF_3$, $MOF_6$, $TeF_6$, $PF_3$, $PF_5$, $AsF_3$, $AsF_5$, $CH_3F$, $CH_2F_2$, $CHF_3$, $C_2HF_5$, $C_2F_6$, $C_3F_8$, $C_4F_6$, $C_4F_8$, $C_5HF_7$, $C_5F_8$, $SiF_4$, $BF_3$, $GeF_4$, CCLF3, C2CLF5, CHFCL2, and a combination thereof.

12. The method of claim 1, wherein the high-pressure fluid is utilized to perform the passivation treatment on material defects in the semiconductor device, wherein an element concentration of elements introduced by the passivation treatment in a region material of the material defects is from 10 ppb to 1%.

13. The method of claim 1, wherein the high-pressure fluid is utilized to perform the passivation treatment on material defects in the semiconductor device, wherein an element concentration of elements introduced by the passivation treatment in a material of the semiconductor device is from $1.0 \times 10^{15}$ atom/cm$^3$ to $1.0 \times 10^{21}$ atom/cm$^3$.

14. The method of claim 1, wherein a pressure within the cavity is from 10 atmospheres to 300 atmospheres, wherein a temperature within the cavity is below 850° C.

15. The method of claim 1, wherein a pressure within the cavity is from 50 atmospheres to 250 atmospheres, wherein a temperature within the cavity is from 100° C. to 600° C.

16. The method of claim 1, wherein the passivation treatment with the high-pressure fluid is anisotropic.

17. The method of claim 1, wherein the first III-V compound is gallium nitride (GaN) and the second III-V compound is aluminum gallium nitride (AlGaN).

18. The method of claim 2, wherein the p-type III-V compound layer is a layer made by p-type gallium nitride (p-GaN).

19. The method of claim 1, wherein the defects of the semiconductor device include at least of: interface defects between the channel layer and the barrier layer, lattice defects, etching defects generated due to etching, and heterojunction defects generated due to heterojunction between material stacks.

* * * * *